(12) United States Patent
Soga et al.

(10) Patent No.: US 6,555,052 B2
(45) Date of Patent: Apr. 29, 2003

(54) ELECTRON DEVICE AND SEMICONDUCTOR DEVICE

(75) Inventors: Tasao Soga, Fujisawa (JP); Hanae Shimokawa, Yokohama (JP); Tetsuya Nakatsuka, Yokohama (JP); Masato Nakamura, Fujisawa (JP); Yuji Fujita, Yokohama (JP); Toshiharu Ishida, Fujisawa (JP); Masahide Okamoto, Yokohama (JP); Koji Serizawa, Fujisawa (JP); Toshihiro Hachiya, Hitachinaka (JP); Hideki Mukuno, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/799,486

(22) Filed: Mar. 7, 2001

(65) Prior Publication Data

US 2002/0066583 A1 Jun. 6, 2002

(30) Foreign Application Priority Data

Jun. 12, 2000 (JP) .......................... 2000-180714

(51) Int. Cl.$^7$ .................. C22C 13/02; H01L 23/48
(52) U.S. Cl. ................ 420/560; 420/561; 257/772; 257/778; 257/779; 257/780
(58) Field of Search ................ 228/223, 224, 228/248.1; 257/738, 751, 753, 760, 737, 772, 778, 779, 780; 142/24; 420/560, 561

(56) References Cited

U.S. PATENT DOCUMENTS

| | | | |
|---|---|---|---|
| 3,097,965 A | | 7/1963 | Wilkins |
| 5,658,528 A | | 8/1997 | Ninomiya |
| 5,985,212 A | | 11/1999 | Hwang et al. |
| 6,046,499 A | * | 4/2000 | Yano et al. ............... 257/712 |
| 6,184,475 B1 | * | 2/2001 | Kitajima et al. ............ 174/260 |
| 6,224,690 B1 | * | 5/2001 | Andricacos et al. ........ 148/400 |
| 6,402,013 B2 | * | 6/2002 | Abe et al. ................. 228/223 |

FOREIGN PATENT DOCUMENTS

| | | |
|---|---|---|
| EP | 0858859 A1 | 8/1998 |
| JP | 8-187590 | 7/1996 |
| JP | 8-206874 | 8/1996 |
| JP | 10-314980 | 12/1998 |
| WO | 97/09455 | 3/1997 |

OTHER PUBLICATIONS

Patent Abstracts of Japan, Publ. No. 09155586—Jun. 17, 1997.
Patent Abstracts of Japan, Publ. No. 10314980—Dec. 2, 1998.
Patent Abstracts of Japan, Publ. No. 10193169—Jul. 28, 1998.
"Mounting Technology of Surface Mount Type LSI Package and Reliability Thereof", Ohyo Gijutsu Suppan Inc. p. 357, 368, Nov. 16, 1998.
12$^{th}$ Environment Adapted Mounting Technology Forum, P4-1, Nov. 28, 2000.

* cited by examiner

*Primary Examiner*—Cathy Lam
(74) *Attorney, Agent, or Firm*—Antonelli, Terry, Stout & Kraus, LLP

(57) ABSTRACT

An electronic equipment is capable of improving falling down shock resistance or impact resistance in an electronic equipment and of improving reliability of a solder joint in a semiconductor device die-bonded Si chip or the like to which thermal shock causing large deformation may act, bump mounting of BGA, CSP, WPP, flip-chip and so forth, a power module acting large stress and so forth. The electronic equipment has a circuit board and an electronic parts to be electrically connected to an electrode of the circuit board. The electrode of the circuit board and an electrode of the electronic part are connected by soldering using a lead free solder consisted of Cu: 0~2.0 mass %, In: 0.1~10 mass %, and Sn: remaining amount.

18 Claims, 9 Drawing Sheets

IMPACT MODEL UPON FALLING DOWN

TRANSMISSION MODEL OF IMPACT (a) DAMPING CHARACTERISTICS OF IMPACT FORCE (b) SOLDER COMPOSITION AND DAMPING CURVE

ELECTRON DEVICE AND SEMICONDUCTOR DEVICE

BACKGROUND OF THE INVENTION

1. Field of the Invention

The present invention relates to a technology applicable for an electronic equipment mounting electronic parts (particularly, a mobile product required high impact strength), a CSP package required resistance of thermal shock, a MCM (multi-chip module) as a semiconductor module, a semiconductor device die-bonded Si chip or the like, connection of a large area power module, and so forth.

2. Description of the Related Art

Currently, in viewpoint of environmental protection, use of Pb free soldering is promoted. It is a worldwide trend irrespective of kind of electronic equipments that solder is transiting from conventional Sn—Pb eutectic type solder to high temperature type solder of Sn—Ag—Cu type, such as Sn-(2.0~4.0)Ag-(0.5~1.5)Cu, which can expect high reliability of joint. In comparison with the conventional full universal type Sn—Pb eutectic type solder, Sn—Ag—Cu type solder has to pay attention for possibility of degradation of reliability of connection in some intended use of product or usage, due to essential difference of metals, particularly due to difference of mechanical strength characteristics.

In general, in comparison with Sn—Pb eutectic solder, Sn—Ag—Cu type solder per se has high strength, high rigidity and high joint interface strength for current metallization. When the parts, printed circuit board and so forth have high strength, Sn—Ag—Cu type solder may achieve reliability comparable or higher than mounting products of the conventional Sn—Pb solder.

However, in contrast to this, when parts, printed circuit board and so forth is low in strength, since solder per se is not broken, stress concentration is caused at joint interface to possibly damage the parts or the like. The important reason is that Sn—Ag—Cu type solder has a property of high strength as mechanical property. For example, in the electronic equipment mounting electronic parts (particularly, moving type mobile product, such as cellular telephone), while Sn—Ag—Cu type solder has high reliability, such as joint strength or the like, it has been pointed out that it has low strength against impact, such as upon falling down, thermal shock and so forth, from experimental facts.

SUMMARY OF THE INVENTION

It is an object of the present invention to improve falling down shock resistance or impact resistance in an electronic equipment.

Another object of the present invention is to improve reliability of a solder joint in a semiconductor device die-bonded Si chip or the like to which thermal shock causing large deformation may act, bump mounting of BGA, CSP, WPP, flip-chip and so forth, a power module acting large stress and so forth.

In order to accomplish the above-mentioned object, according to the first aspect of the present invention, an electronic equipment has a circuit board and an electronic parts to be electrically connected to an electrode of the circuit board, wherein, as described in Claims of the present application, the electrode of the circuit board and an electrode of the electronic part being connected by soldering using a lead free solder including:

Cu: 0~2.0 mass %;
In: 0.1~7.0 mass %; and
Sn: remaining amount.

Preferably, the lead free solder may be including:
Cu: 0.1~1.5 mass %;
In: 0.5~2.0 mass %; and
Sn: remaining amount.

Also, the lead free solder may be consisted of:
Cu: 0.1~1.5 mass %;
In: 0.5~7.0 mass %;
Ag: 0~1.0 mass %; and
Sn: remaining amount.

In the further alternative, lead free solder may be including:
Cu: 0.1~1.5 mass %;
In: 0.5~7.0 mass %;
Ag: 0~1.0 mass % and
Sn: remaining amount.

The electrode of the electronic part may be a solder bump formed with lead free solder.

The electrode of the electronic part may be solder connected by forming a plating layer of Sn-(1~10) mass % Bi.

The solder connection may be established by forming a plating layer of Sn-(0.2~2) mass % Cu on the electrode of the electronic part.

According to the second aspect of the present invention, a semiconductor device comprises a semiconductor element and a bump to be electrically connected to the semiconductor element, the solder bump being lead free solder including:

Cu: 0~2.0 mass %;
In: 0.1~7.0 mass %; and
Sn: in remaining amount.

According to the third aspect of the invention, a semiconductor module having a circuit board and an electronic parts to be electrically connected to an electrode of the circuit board, wherein the circuit board and an external connection terminal to be externally connecting portion to be connected electrically being connected by soldering using a lead free solder including:

Cu: 0~2.0 mass %;
In: 0.1~7.0 mass %; and
Sn: remaining amount.

More particularly, by employing a material easy to deform and superior to elongate than Sn—Ag—Cu type solder when impulsive large force act on the solder, stress load in the joint interface of the parts can be eliminated without degrading reliability in heat cycle of the joint to improve falling down resistance and impact resistance to improve thermal shock absorbing function for large deformation. Namely, as Pb free solder of Sn base used in the joint portion, a material having small stress and material easy to deform is prepared by solving In which is softer than Sn in the matrix of Sn or Sn—Cu to improve falling down resistance and impact resistance by absorbing impact to be exerted on the joint interface as falling down.

By this, impact energy upon falling down is absorbed by plastic deformation of the solder per se to reduce stress to be exerted on the joint interface. Therefore, large impact force will not act on the joint interface to improve impact resistance.

On the other hand, even in solder bump connection of the semiconductor device die-bonded the Si-chip or the like, mounting of BGA, CSP, WPP (Wafer Process Package), flip-chip and connection of large area power module to which large stress act, upon soldering causing large deformation and upon thermal shock acceleration test or the like, breakage due to stress concentration at the interface is prevented and reliability of connection can be achieved by employing a material having low strength and easy to deform.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DETAILED DESCRIPTION OF THE EMBODIMENT

Figure 1A:
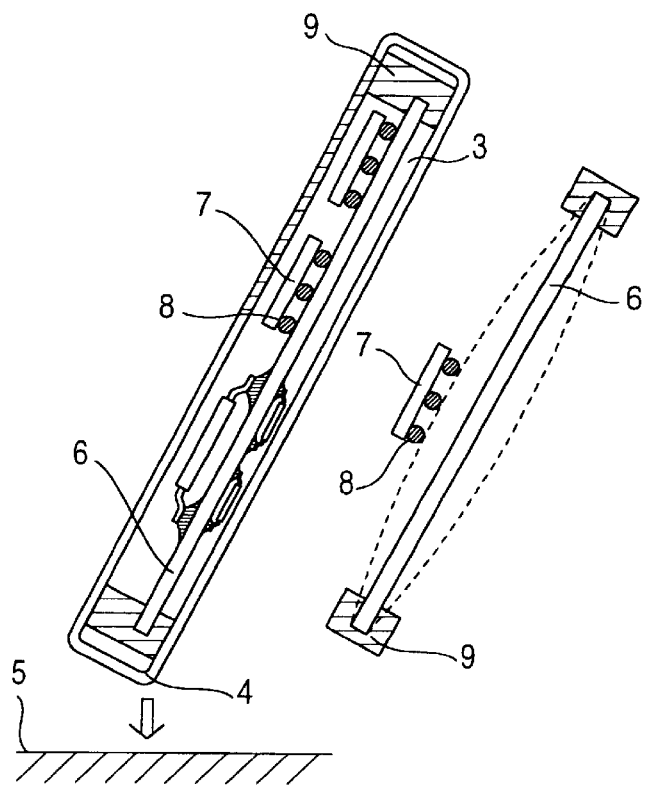
FIGS. 1A and 1B are an illustration showing a shock transmission model when a cellular telephone is fallen down.

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structure are not shown in detail in order to avoid unnecessary obscurity of the present invention.

At first, discussion will given for impact for the case where an electronic equipment, such as a cellular telephone or the like is fallen down.

In a casing of the electronic equipment, such as a cellular telephone or the like, various parts, LSIs (packages of BGA, CSP, TSOP, TQFP and so on) are mounted on a printed circuit board. Such parts and LSIs rarely damaged by normal falling down. However, falling down from high position, in certain falling down site, in some colliding condition can result in damaging at joint interface of joints for large shock exerted thereto. Weights of the parts, LSIs and so forth, them may withstand even at increased acceleration. A significant problem is bending deformation of the printed circuit board due to impact force and impact transmitted through the printed circuit board. Needless to say, it is important for damping such impact force, shock absorbing performance of the casing and printed circuit board is important. For impulsive shock, the casing is hardly deflected but can be provided role and performance as a damper. The impact force is transmitted to the printed circuit board via the casing to exert a load on a solder joint from the printed circuit board. The printed circuit board is relatively large and easily deflected in a longitudinal direction. Therefore, an impact force due to large bending in fundamental vibration of half wavelength, can be exerted. At this time, a free vibration is caused in a condition where the peripheral portion of the printed circuit board to be absorbed. High frequency vertical vibration transmitted in the printed circuit board to generate a lateral wave. The vertical vibration is an elastic wave and is a motion to be straightly transmitted in series. Such shock can be absorbed by providing bumper like function in a support portion of the printed circuit board. Larger force which cannot be fully absorbed by the support portion can be exerted on the joint. When no damper is present in the printed circuit board restricting portion, such large force is straightly transmitted to the joint via the printed circuit board. On the other hand, lateral vibration due to deformation of the printed circuit board, while variable depending upon restricting condition of the printed circuit board, instantly causes large deformation to create large bending stress to cause breakage at the interference by deflection of the printed circuit board and so forth.

Figure 1B:
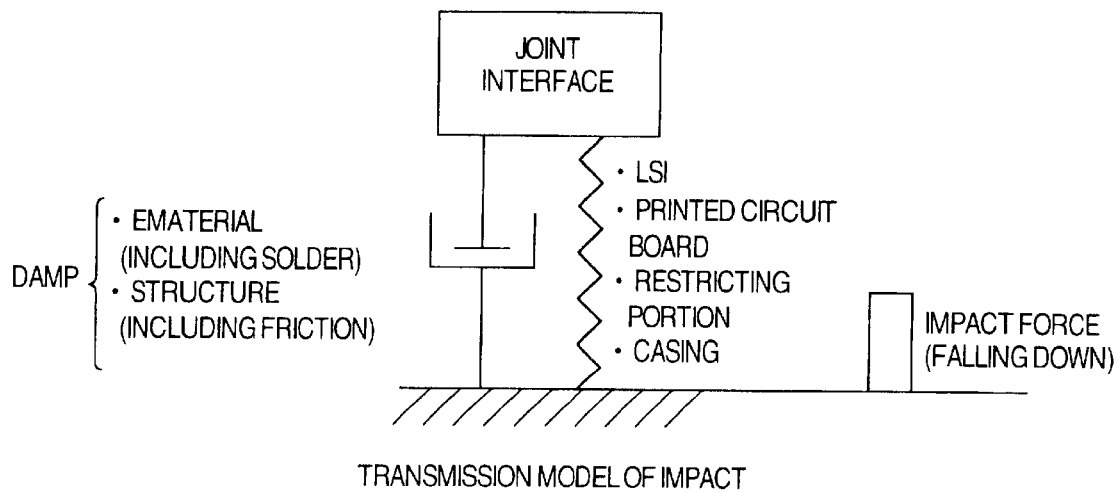

FIG. 1 shows a impact model (FIG. 1A) illustrating influence of impact for a joint 8 of LSI package 7 or the like due to natural vibration of the printed circuit board when the electronic equipment, such as cellular telephone is fallen down to collide the end portion 4 on the ground surface 5 and an impact from the casing is transmitted to the printed circuit board 6 via restricting portions 9. Expressing this in vibration mode with a single-degree-of-freedom damping, an impact transmission model as shown in FIG. 1B is considered. Impact transmission is transmitted as vertical vibration and lateral vibration in series of the ground surface, the casing, the restricting portion, the printed circuit board, the joint, LSI package. Damping can be assumed as series damping of loss by collision of the ground surface and the casing, loss by material damping of the casing, loss by material damping of the restricting portion, loss by friction between the restricting portion, the casing and the printed circuit board, loss by material damping, loss by material damping of solder, loss by deformation of solder, loss by material damping of the LSI package and so forth. Considering impact transmission path from the ground surface to the LSI package, damping system can be divided as material damping including solder and structural damping including friction. In case of vibration transmission system from the ground surface to the LSI package via the casing, the restricting portion, the printed circuit board, the joint for transmitting the impact as lateral vibration, as a mode possibly cause deformation in general, natural vibration mode at half wavelength in the longitudinal direction of the printed circuit board with bowing the center portion of the printed circuit board. At this time, large bending stress is instantly act on the solder joint. In case of the solder having high rigidity, deformation can be absorbed by the solder to exert large surface on the joint interface. If not withstand, breakage is caused. At this time, when the solder is soft, the force to be exerted on the joint interface can be absorbed by causing plastic deformation. It should be noted that since the parts, such as the LSI package, used in the cellular telephone, is typically small and light weight, impact force by their own weight as exerted the impact is considered to be small.

Therefore, study has been made for addition of In for lowering a soldering temperature, for making the solder per se easily deformable, for certainly provide high reliability against heat cycle or the like, for property modification of Sn crystal preventing the solder from causing deformation to easily form solution in a matrix but difficult to be harden to certainly obtain high reliability.

Particularly, since it is important to provide high deformability for Sn matrix (crystal) per se, study has been made for addition of In with taking Sn—Cu eutectic type solder which is soft and superior in elongation.

Figure 2:
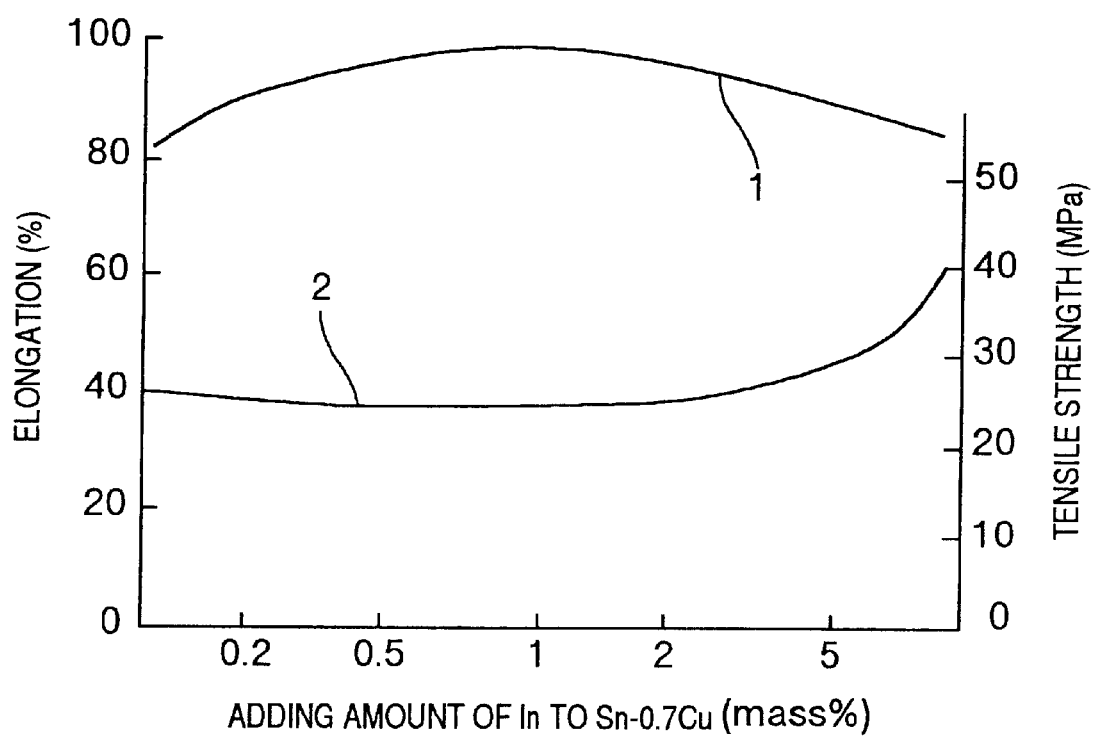
FIG. 2 is an illustration showing an additive amount of Ag to Sn-0.7Cu and expansion and tensile strength.

FIG. 2 shows an extension 1 and tensile strength 2 when In is added to Sn-0.7Cu. The horizontal axis is shown using logarithm.

From FIG. 2, it can be appreciated that elongation can be improved only by adding In in amount of about 0.2 to 7.0 mass % to Sn-0.7Cu. Particularly, in addition of about 0.5 to 2.0 mss % of In, it can be appreciated that improvement of elongation in more than or equal to 10% than that of Sn-0.7Cu can be realized. In general, fine amount of metal is added to crystal grain, strength is improved but elongation is lowered. However, since In is softer than Sn, strength is not increased but superior characteristics in elongation can be achieved. When the strength is lowered and elongation is increased, stress to be exerted in the interface can be lowered to improve impact resistance. When high strength is exerted, impact energy can be absorbed by deformation of solder.

When an added amount of In is less than about 2 mass %, extension strength changes only a little. However, when an added amount of In is more than or equal to 5 mass %, melting temperature decreases and extension strength increases. When extension strength increases, even if strong impact is applied, it becomes difficult to deform solder, so that anti-impact characteristic deteriorates. Accordingly, in viewpoint of tensile strength, it can be appreciated that greater than or equal to 5 mass % of In is not preferred to be added.

On the other hand, Sn—Cu eutectic type solder used as base has about 10° C. higher melting point in comparison with Sn—Ag—Cu eutectic type. Therefore, Sn—Cu eutectic type solder has not attracted attention as solder for surface amounting. However, by adding In as set forth above, the melting point is lowered to enable soldering at soldering temperature comparable with Sn—Ag—Cu eutectic type. It should be noted that as composition of Sn—Cu to be the base, since In is added to Sn-0.7Cu eutectic type solder, while variable depending upon In amount, Cu is preferably about 0.1 to 0.7 mass % less than that in eutectic. In general, when metallization is Cu, in consideration of prevention of upstaging, it is preferred to add In in greater amount. Therefore, a range 0 to 2.0 mass % is effective.

In the following table 1, melting points (liquid phase line, solid phase line) and hardness of Sn—Cu-In type solders are shown. A rate of raising temperature is 2° C./minute. When hardness is measured, weight of 100 g is imposed. By adding In to Sn—Cu eutectic solder, joint structure which reduces soldering temperature and strength and does not reduce elongation is realized. In all the instances, even if In is added to, since soft In is soluble in Sn matrix, the hardness changes only slightly.

As described above, by adding In which penetrates into Sn—In matrix, maintains elongation (deformation ability) and makes the solder per se softer than Sn on a basis of Sn—Cu eutectic solder, stress concentration in the interface can be avoided to achieve improvement of impact resistance and thermal shock resistance of electronic parts even by Sn type. Namely, by addition of In, tensile strength is not changed significantly but elongation is increased. Therefore, impact is applied, solder per se is deformed to absorb impact energy. In the joint interface, since large force does not act, in solder bump connection of BGA, CSP, WPP, flip-chip or the like, breakage at the conventional interface can be restricted. This phenomenon is effective not only for impact resistance but also for thermal shock resistance in heat cycle.

TABLE 1

| No | Composition | Melting Point ° C. (Liquid Phase, Solid Phase) | Hardness (Hv) |
|---|---|---|---|
| 1 | Sn-0.7 Cu | 232.8~229.2 | 18 |
| 2 | Sn-0.7 Cu-0.2 In | 232.2~228.7 | 12 |
| 3 | Sn-0.7 Cu-0.5 In | 231.6~227.4 | 13 |
| 4 | Sn-0.7 Cu-1.0 In | 230.8~225.7 | 13 |
| 5 | Sn-0.7 Cu-2.0 In | 228.5~220.9 | 13 |
| 6 | Sn-0.7 Cu-5.0 In | 222.7~215.4 | 19 |

While discussion has been given with taking Sn—Cu type eutectic type solder as base, Sn—Cu type eutectic type solder per se is a material superior in elongation.

Solders to be base, in addition to Sn—Cu type eutectic solder, study have been made for Sn—Ag type solder, Sn—Sb type solder. However, when Sn—Ag type solder is taken as base, the needle type $Ag_3Sn$ compound is dispersed in Sn to reinforce, or $Ag_3Sn$ is formed in network form in Sn granular portion, strength is increased to straightly transmit the stress to the joint interface upon exertion of impact or thermal shock. Breakage can be caused at the interface of weak part.

In Sn—Sb type solder, Sb is solved in Sn to reinforced to be strengthened similarly to Sn—Ag type solver to degrade deformability. Therefore, Sn—Cu type solder is preferred to be the base.

Figure 3:
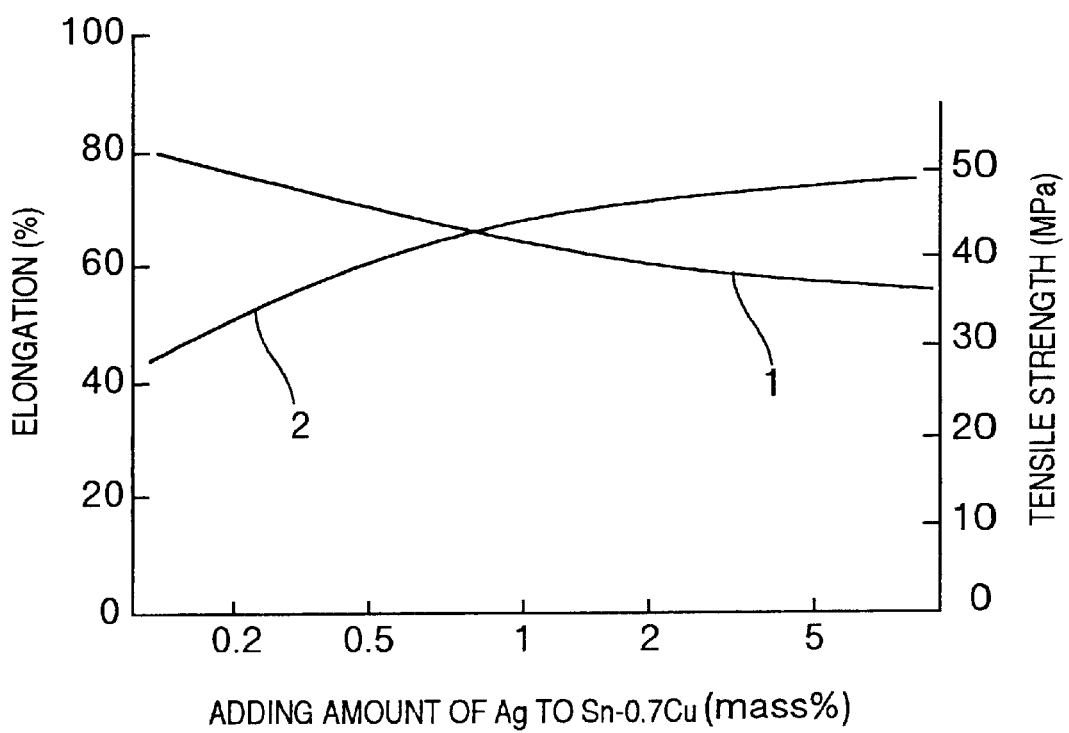
FIG. 3 is an illustration showing an additive amount of Ag to Sn-0.5 Cu and expansion and tensile strength.

On the other hand, study has been made for Sn—Ag—Cu type solder. FIG. 3 shows a relationship between the elongation 1 and the tensile strength 2 of the case where Ag is added to Sn-0.7Cu eutectic (228° C.).

As can be appreciated from FIG. 3, lesser amount of Ag increases elongation and conversely decreases tensile strength. Namely, in Sn-0.7Cu, elongation becomes maximum and tensile strength becomes minimum. Therefore, improvement of deformation ability and improvement for reducing stress load to the connection part of the solder by Ag can not be expected.

On the other hand, from this result, it can be expected that lesser dispersion of needle form $Ag_3Sn$ in Sn matrix achieves higher elongation and lower strength. Namely, it can be estimated that improvement for superior impact resistance can be achieved at lesser Ag. Accordingly, not only Sn—Ag—Cu type solder but also Sn—Ag type solder, the same action pf $Ag_3Sn$ is considered to result in estimation that sufficient impact absorbing function cannot be obtained.

On the other hand, in Sn-0.7Cu solder, $Cu_6Sn_6$ is dispersed in Sn matrix. In comparison with Sn-3.5Ag eutectic solder, dispersion amount becomes small, and $Cu_6Sn_5$ is not capillary crystal as $Ag_3Sn$. Accordingly, in Sn-0.7Cu eutectic type solder, $Cu_6Sn_5$ will not affect for intergranular deformation.

For example, in heat cycle test of two through hole joint of Sn-3Ag-0.7Cu and Sn-0.7Cu, dendrite of Sn-3Ag-0.7Cu solder exhibits tendency of linear growth. Plastic deformation at the position where stress is exerted after heat cycle test is difficult to observe externally and straight crack is observed. Growth of dendrite of Sn-0.7Cu solder is not so straight and shows clear plastic deformation in external appearance at the position where stress is exerted after heat cycle test.

From the above, Sn—Cu type solder is superior in thermal shock in the condition of joint than Sn—Ag type solder or Sn—Ag—Cu type solder. Sn—Cu type solder is selected as base solder.

Figure 4:
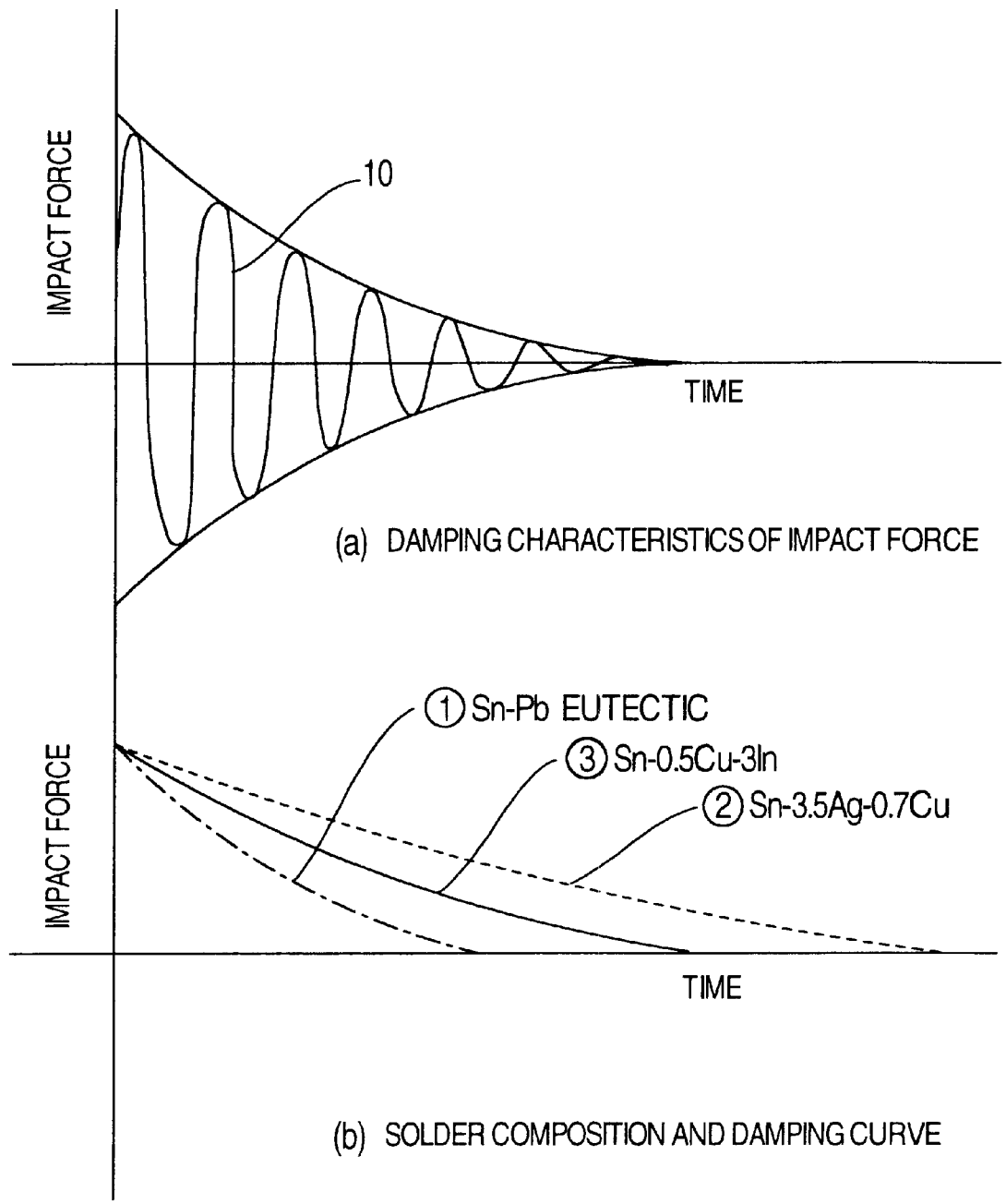
FIG. 4 is an illustration showing variation per time of an impact force.

FIG. 4 shows variation per hour of impact force to be transmitted from the joint as measured by an acceleration sensor stuck on the LSI package. A high-frequency wave 10 represents a longitudinal elastic wave. FIG. 4 takes an impact force in vertical axis and a time in lateral axis to show a condition of attenuation of image according to elapse of time. At this time, while time shift may be present, the lateral vibration is considered to be maximum. In FIG. 4, an extinction curve (1) shows variation of impact force in the conventional Sn—Pb eutectic solder, an extinction curve (2) shows variation of impact force in the conventional Sn-3.5Ag-0.7Cu solder and an extinction curve (3) shows variation of impact force in Sn-0.5Cu-3In solder. At this time, impact input applied to the joint is assumed to be the same. In case of large impact force, the conventional Sn—Pb eutectic solder per se cause deformation easily (since Sn, Pb are fine particle to have large surface area to easily disposition by deformation due to slip in the grain boundary). Therefore, impact energy is absorbed by solder due to deformation of solder in the joint. However, temperature dependency and deflection speed dependency are large, good property is exhibited against an impact in the room temperature. On the other hand, Sn-3.5Ag-0.7Cu solder as typical solder of Sn—Ag—Cu type has large strength and difficult to deform to straightly transmit the impact force to joint interface. When joint interface is low, breakage of interface can be caused.

By impact Charpy test, It has been known that Sn—Ag type (Sn-4Ag) has been known to have higher absorption energy than Sn—Pb eutectic (Sn-40Pb) (For example, "Mounting Technology of Surface Mount Type LSI Package and Reliability Thereof", Oyo Gijutsu Shuppan Inc. p368, Nov. 16, 1988). By this, impact strength at the room temperature is Sn-40Pb : 24(ft-lb), Sn-4Ag : 38 (ft-lb) and Pb-10Sn : 8 (ft-lb). On the other hand, it has also been known that absorption energy is lowered by adding Bi to Sn—Ag (for example, 12th Environment Adapted Mounting technology Forum, p4-1, Nov. 28, 2000). Addition of Bi makes solder brittle. Therefore, it can be expected easily as a manner of course that the impact value is lowered by addition of Bi. Also, it can be appreciated that high b solder (Pb-10Sn) has low impact value.

Sn—Pb type solder has high deflection speed at application of impact as a matter of course, and has significant deflection speed dependency and temperature dependency. In consideration of the fact that no problem has been upon falling down of the cellular telephone using the current Sn—Pb eutectic solder, such problem will not be caused for falling down in room temperature condition. At this point, high Pb type solder has lesser temperature dependency and deflection dependency, and superior stability. High Sn type solder abruptly lower impact value at low temperature (−55° C.). This is caused by increase of brittleness. However, elongation and strength can be certainly provided, no problem will be arisen normally. From these data, relationship with the following phenomenon will be observed.

Heretofore, in case of Sn—Ag—Cu type solder, in case of joint structure where heat cycle is severe, since the solder per se is not easily deformable, there is high possibility of causing damage at the joint interface in some parts. Shock upon falling down, behavior close to that set forth above is considered to be caused. If solder is soft (stress is small and elongation is superior), solder may cause deformation to act large stress on the joint interface. This is the function of the solder. Sn—Pb eutectic solder has such superior function. High Pb solder (Sn-10Pb) is also soft and has similar function. Mechanism of high Pb solder has a structure, in which Sn is solved in Pb matrix which is soft. While there is a difference in metallographic structure from Sn—Pb eutectic (aggregate of fine crystal), similar effect can be achieved as stress is not applied to joint interface.

A reason why Sn—Ag—Cu type solder having high impact value in Charpy test is not preferable for falling down shock is too high strength. The cause is, as can be expected from FIG. 3, that needle form $Ag_3Sn$ is dispersed in Sn crystal to form reinforced composition. It can be expected that the strength can be lowered and elongation can be increased by reducing Ag content $Cu_6Sn_5$ is dispersed in Sn crystal) has small Cu amount in Sn crystal and does not form needle shape crystal as $Ag_3Sn$ to lower melting point from 232° C. to 227° C. In order to enhance shock absorbing performance, it is required to lower strength of solder, increase elongation and make more easily deformable. Therefore, it is effective to add In which is easily solved in Sn crystal and softer than Sn. By this, melting point can also be lowered.

As one of typical examples of the present invention, Sn-0.5Cu-3In solder as shown by curve (3) cannot absorb the impact energy as Sn—Pb eutectic type solder but shows high impact absorbing characteristics depending upon deformation effect by addition of In in Sn matrix. This deformation characteristics depends on intergranular deformation by softness of Sn matrix. Greater amount of In results in lower melting point, and as long as absolute value of strength is not increased, some impact force absorbing effect can be attained. From these, it can be appreciated that impact resistance and thermal shock resistance of the parts joint can be improved by using Sn—Cu—In type solder.

Next, discussion will be given for an example for improving reliability of connection as applied for connection of the semiconductor device die-bonded Si chip or the like or the large area power module, to which a large stress acts.

Figure 5A:
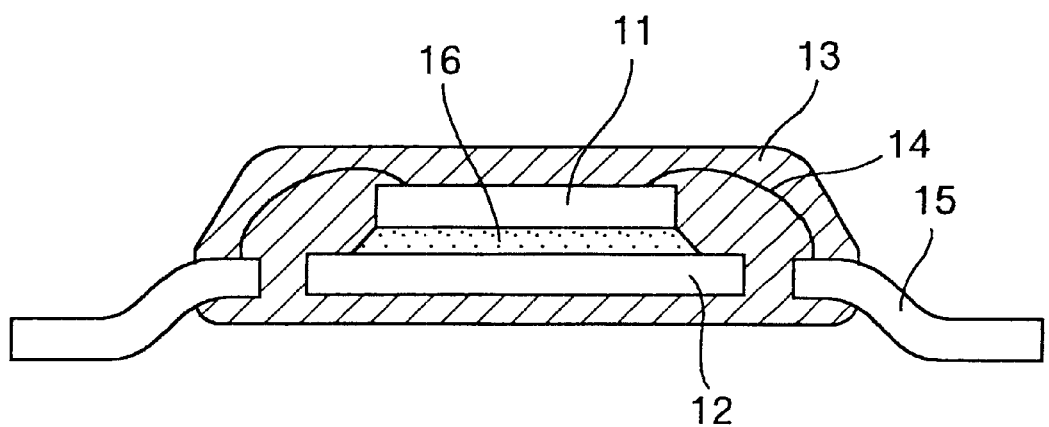
FIGS. 5A and 5B are illustration showing packages.

FIG. 5A shows a section model of a structure of LSI resin package 13, in which metallization is provided on the back surface of a Si chip 11 and the Si chip 11 is die-bonded on Ni/Au plated Fe—Ni alloy (base) 12. A terminal on the Si chip is electrically connected to a lead wire 15 via a bonding wire 14. Bonding 16 is performed using about 150 μm thick solder foil and by way of flux less soldering under nitrogen or hydrogen atmosphere. If washing is possible in the post process, solder paste may be used. In this case, reflow connection in the atmosphere. When a difference of thermal expansion coefficients is large between the Si chip and the base, or a large size chip is to be connected, if the conventional Sn—Ag—Cu type solder which has high strength and high rigidity, the chip can be broken in severe manner of use in heat cycle test. In contrast to this, by using Sn—Cu—In type solder, since the solder may cause deformation at relatively small stress, breakage of the Si chip can be prevented. Particularly, solder having high melting point is necessary, Sn-0.1In, Si-2In, Si-(0.3~0.7)Cu-1In or Sn-(0.3~0.7)Cu-2In And so forth are preferred.

Figure 5B:
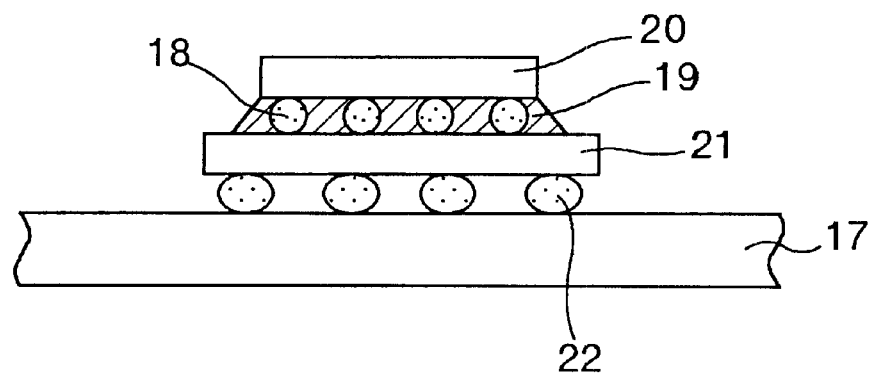

FIG. 5B shows one example where bare chip, CSP or BGA is connected to a printed circuit board 17. Solder for external connection terminal may be supplied in a form of ball on a chip carrier board of CSP, BGA and so forth or in a form of solder paste to electrode on the printed circuit board. Since the solder 18 for the package is reinforced by a resin 19, deformation ability is not significant. If thermal hierarchy is given importance, bump connection between the chip 20 and the chip carrier board 21 may be Sn-5Sb or a conductive resin. Namely it is only required that the joint structure is established at higher temperature than the melting point of the solder bump 22. On the other hand, portions to be connected to the printed circuit board 17, has to be provided impact resistance. Therefore, Sn-0.5Cu-3In solder 22 is used, It has been found that Sn—Cu—In type solder is stronger in 20 to 50% in comparison with Sn—Ag—Cu type solder against bowing of the printed circuit board, against thermal shock or impact. Also, in the shown embodiment, Sn—Cu—In type solder ball is supplied on the terminal electrode on the chip carrier board 21. The solder balls are fixed on the printed circuit board by the solder supplied in a form of paste. In this case, by supplying Sn—Cu—In type solder for the electrode on the chip carrier board, impact can be absorbed at the portion where stress is concentrated. In general, the chip carrier side is often formed with a material to have large difference of thermal expansion with the solder and have smaller terminal area to cause breakage by stress concentration. However, in some construction or material, it is possible that the interface on the printed circuit board side is weaker. In such case, by preliminarily provided surface treatment of Sn—In or In plating on the printed circuit board, effect of In can be attained. Namely, upon reflow connection via Sn-3Ag-0.5Cu ball on the chip carrier side or Sn-3Ag-0.5Cu paste, even when it is mixed uniformly, Ag concentration is reduced and the entire paste becomes softer for the presence of In. In certain process more In rich Sn—Ag—Cu type solder (while Ag concentration cannot be zero, but can be reduced) can be formed in the vicinity of interface on the side of the printed circuit board to increase softness and elongation b to achieve superior impact resistance.

Figure 6:
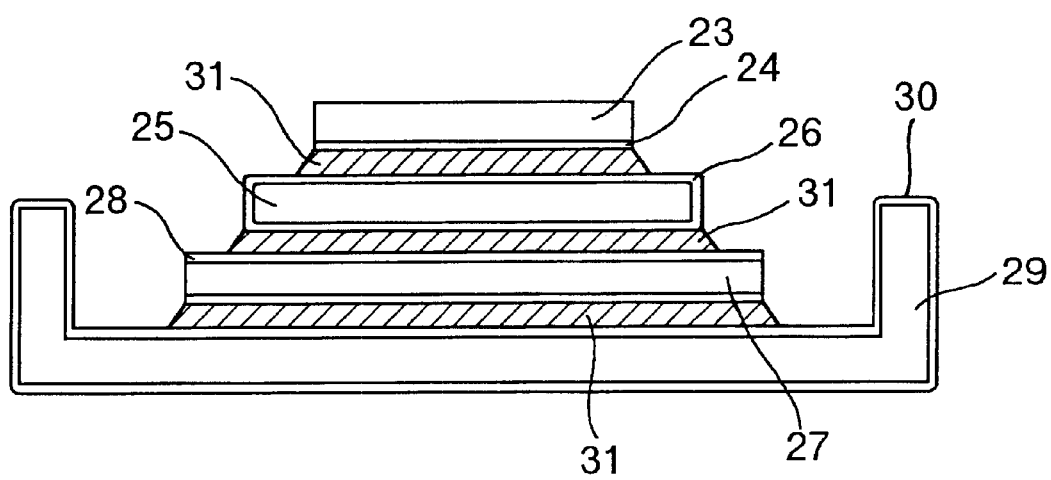
FIG. 6 is an illustration showing a section of a power module.

FIG. 6 is an example applied for the large size power module. A Si chip 23 has 20 mm in diameter, metallized layer 24 is Al/Ti/Ni/Au. For a molybdenum plate 25 serving as stress absorbing material is provided Ni plating 30. $Al_2O_3$ insulation substrate is provided W-sinter-Ni-plating 28. Also, for Cu plate 29 is provided Ni plating 30. For soldering the above-mentioned components, a solder foil having about 150 µm of thickness is used for reflow connection under nitrogen or hydrogen atmosphere. Therefore, soldering can be performed without washing. If washing is possible, connection by reflow connection in the atmosphere with the solder paste can be performed. While Sn-0.7Cu-1In, Sn-0.5Cu-4In, Sn-1.5Cu-5In are used as composition of solder 31. Any of these can prevent breakage of Si chip and can clear heat cycle test in a temperature range of −55 to 125° C. for 1000 cycles to achieve high reliability.

It should be noted that Sn—Cu—In type solder is superior in thermal shock resistance for lead parts of joint subjecting severe condition, one strength of chip and metallization strength of the chip is not certainly obtained. In case of the lead part, Sn—Cu—In type solder is superior in impact resistance and thermal shock resistance for Fe—Ni type, Cu type leads provided with Sn-(1~10)Bi plating, Sn-(0.2~2)Cu plating or the conventional Sn-10Pb plating, and certainly provide high reliability as the joint.

As discussed above, when weak parts are mounted by surface mount, large stress may act on the joint portion upon soldering. However, by using Sn—Cu—In type solder, the parts having low breaking strength is not broken and Pb free soldering is possible. When solder having high melting point is required, Sn-0.7Cu or SN-0.7Cu-7In-0.1In may be used and when solder having low melting point is required, Sn-0.5Cu-5In or Sn-0.5Cu-7In may be used. Further, when the strength of the components is maintained in a required degree, Sn-0.8Ag-0.5Cu-3In etc. may be used for attaining the strength of the joint.

As set forth, for attaining Sn base Pb free solder which is easily deformed and superior in elongation, In softer than Sn is solved in the Sn matrix. By this shock absorbing effect for absorbing shock upon falling down can be expected. Namely, impact energy upon falling down can be absorbed by plastic deformation of the solder per se, and the stress to be exerted on the joint is absorbed by its own deformation so that large impact force may not act on the joint interface. Thus, superior impact resistance can be achieved. In case of the solder which is difficult to be deformed upon collision, kinetic energy upon collision can directly act on the joint interface to easily cause interface breakage.

On the other hand, Sn—Cu—In type solder can achieve high reliability in die-bonding of large size Si chip or the like as parts to be easily broken, solder bump connection of BGA, CSP, WPP, flip-chip or the like, and the large area power module, to which large stress acts.

Furthermore, when Ag is not contained, needle shape crystal by Ag is not created to avoid possibility of occurrence of migration, shorting or so forth. Thus, high reliability of connection can be achieved.

Accordingly, by using the foregoing composition, in BGA, CSP, bare chip mounting etc., it can be achieved not only improvement of falling down resistance, impact resistance of mobile product but also superior in board bending resistance anti-probing inspection ability (bowing ability). On the other hand, Sn—Cu—In type solder is adapted to parts die-bonded Si chip or the like which is weak against thermal shock causing large deformation and mounting of power module as large size chip. Also, by adding In to Sn—Cu, soldering temperature becomes comparable with that of Sn—Ag—Cu type solder. When high strength is required for Sn—Cu—In type solder, less than or equal to 1 mss % of Ag may be added. Then, lowering of elongation can be restricted.

Furthermore, by adding less than or equal to 1 mass % of Bi to Sn—Cu—In type solder, shortening of life time can be restricted, and good flow ability of the solder can be attained. Thus, effect of bridge prevention and chip election prevention can be expected.

Figure 7A:
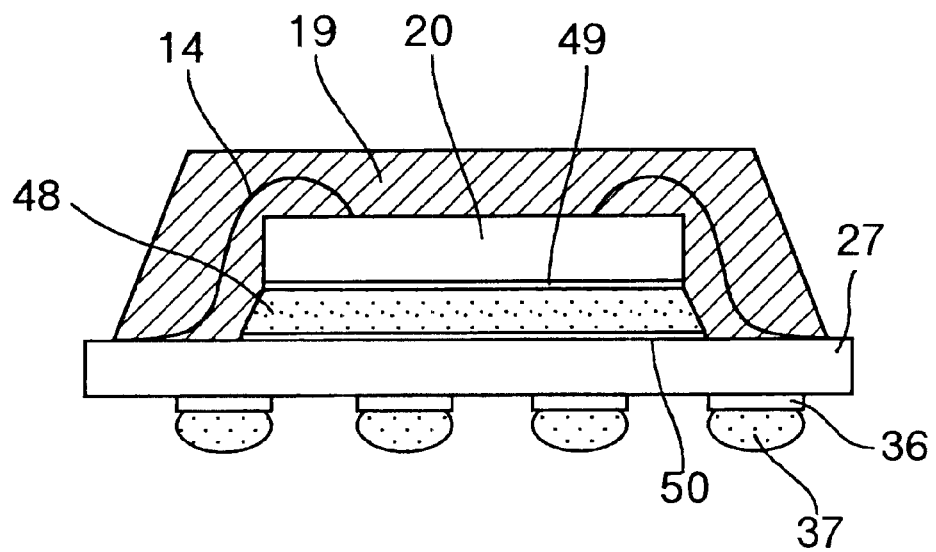
FIGS. 7A and 7B are illustrations showing BGA and CSP section model of a wire bond type conductive resin bump.
Figure 7B:
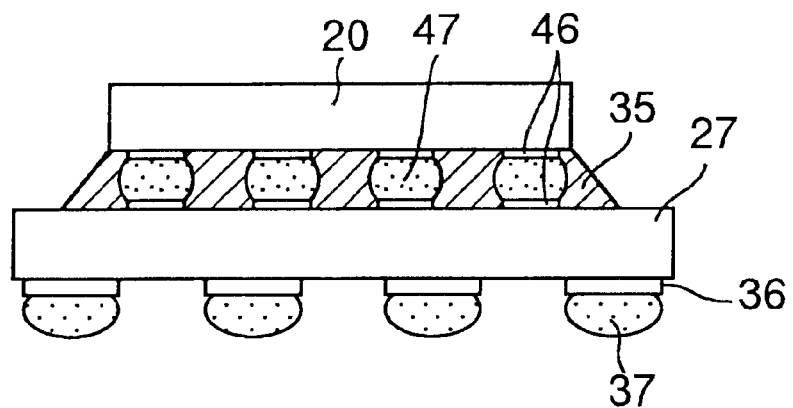

FIG. 7A shows wire bonded BGA or CSP, in which lower side of the Si chip 20 is bonded by a conductive resin 48. In this case, the terminal portions are preferably Ni/Au or the like which is difficult to be oxidized the surface, is stable (including metallize-less), and bonding can withstand reflow at 250° C. On the other hand, in application of power-parts in wire bonding, it is possible to use a composite solder foil, in which Cu and Sn are mixed for connection with Cu—Sn intermetallic compound to form a package having strength withstanding to reflow. Possible compounds other than Cu—Sn may be Ni—Sn, Au—Sn, Ag—Sn, Pt—Sn and so forth. FIG. 7B shows a bump of the conductive resin 47 in the flip-chip structure. In this case, both terminal portions on the chip side and printed circuit board side are Au, Ni/Au46 and the like, surface of which is difficult to be oxidized to form connection which can withstand against reflow at 250° C. Furthermore, a resin 35 having Young's modulus 5 to 1500 $kgf/mm^2$ for certainly achieving mechanical strength and improvement life time, and thermal expansion coefficient : $10\sim60\times10^{-6}/°$ C., is filled.

It is also possible to provide Sn plating or the like on the terminal of the relay board, apply a resin over the chip bonding portion including the terminal portion in advance, absorbing the chip on which bump of Au or the like is formed preliminarily, to a capillary of pulse heater heating, position the Au bump to the terminal of the relay board, thereafter pressurizing to contact the Au bump to the Sn plating, and heat melting. In this case, thermoplastic resin which can be repaired (reduction of expansion can be done by adding quartz filler) can be used for filling a gap between the chip and the relay board even less than or equal to 50 μm. It should be noted that construction of the chip terminal and terminal of the relay board is not limited to the foregoing construction.

To the external connection electrode terminal of various BGA, CSP, as composition of solder to absorb impact resistance, Sn-0.3Cu-3In, Sn-0.7Cu-2In, Sn-0.7Cu-0.2In, Sn-0.7Cu-5In and so forth may be used. When Ag is contained in such Sn—Cu eutectic type, needle form $Ag_3Sn$ is dispersingly solved in Sn matrix, strength of solder per se becomes too high to make solder difficult to deform to result in exertion of larger stress to the joint interface. Problem of Sn—Ag—Cu type Pb free solder resides on this point. Even though no problem is arisen in normal joint, in certain structure having small design margin, weak point may appear. A measure for such weak point may be provided by Sn—Cu—In type solder. Sn—Cu is dispersed type eutectic of $Cu_6Sn_5$ and does not form needle form such as $Ag_3Sn$ to be low in strength and improve elongation. Namely, Sn—Cu has composition easy to deform and difficult to cause stress concentration. In case of Sn-0.75Cu eutectic, melting point is as high as 228° C. By adding In, melting point is lowered and soft In is solved in Sn matrix to form a system which can be deformed more easily. By this, composition can be selected for the case where impact resistance seeking for flexibility is given importance, for the case where heat resistance of the part is also considered, and for the case where join strength is further considered. The solder bump may be supplied on the relay board terminal in a form of ball, by printing, by electro-plating, or by tinning.

Figure 8:
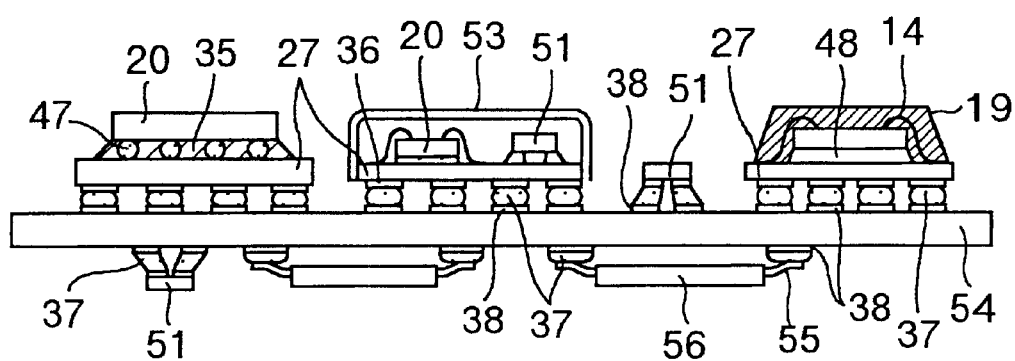
FIG. 8 is an illustration showing a section model of printed circuit board mounting BGA, CSP, module, chip parts and so forth.

FIG. 8 shows an example, in which BGA, CSP, TSOP 56, chip part 51, function element (for example, high frequency RF module used for signal processing used in cellular telephone or the like) and so forth are mounted on an organic substrate 54 for cellular telephone. A maximum temperature of reflow is 235° C. comparable with Sn-0.7Cu-5In (melting point : 222.7~215.4° C.), Sn-3Ag-0.5Cu (melting point : 221~217° C.). RF module is constructed by mounting GaAs or Si chip and chip parts as passive element on $Al_2O_3$ board 27 which is superior in thermal conductivity and mechanical characteristics, which is one kind of MCM (multi-chip module). Connection of several about 2×2 mm chips 20 and chip parts 51 are compact to have small stress. Dimension of a module board ($Al_2O_3$ board in this case) mounting the chips 20 and the chip parts 51 is in a level of 10×10 mm. For the printed board, reliability of connection is sufficiently obtained. Particularly, concerning wire bonded chip, re-melting in reflow of the printing board may influence for characteristics. Therefore, back side of the chip is formed as Au electrode, and $Al_2O_3$ substrate 27 side is formed as Ni/Sn plating electrode for die-bonding connection. Au—Sn intermetallic compound is not molten in reflow at 260° C. It should be noted that since the chip part is 1005 level, even if Sn-3Ag-0.5Cu solder is used, and the solder is re-molten during reflow of the printed board, for example, it can be fixed by action of surface tension so as not to affect for characteristics. External connection terminal portion 36 of the RF module is Ni/Au plating. The lead of the TSOP package 56 is formed by providing Sn/Bi plating (about 7 μm thick) on 42 alloy lead 55. Reflow connection is initially performed on the lower surface of the light weight package by Sn-0.7Cu-5In or the like, and then reflow connection 37 is performed similarly on the upper surface of the light weight package by Sn-0.7Cu-5In or the like. Already connected light weight parts may not fall down for light weight, upon reflow of the parts on the upper surface so as not to affect for characteristics. Selection of composition of Sn—Cu—In type solder has to be done in consideration of heat resistance, impact resistance, joint strength of the parts.

Figure 9A:
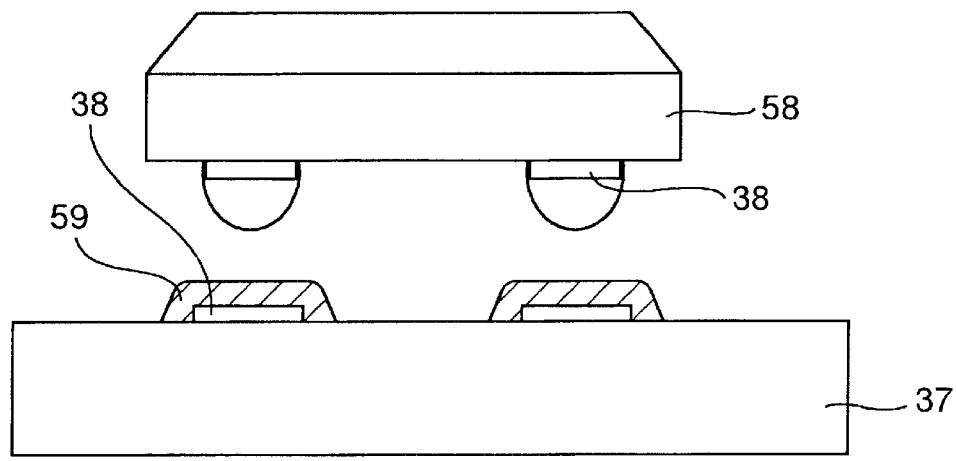
FIGS. 9A and 9B are illustration showing section models joined CSP package on an organic printed circuit board.
Figure 9B:
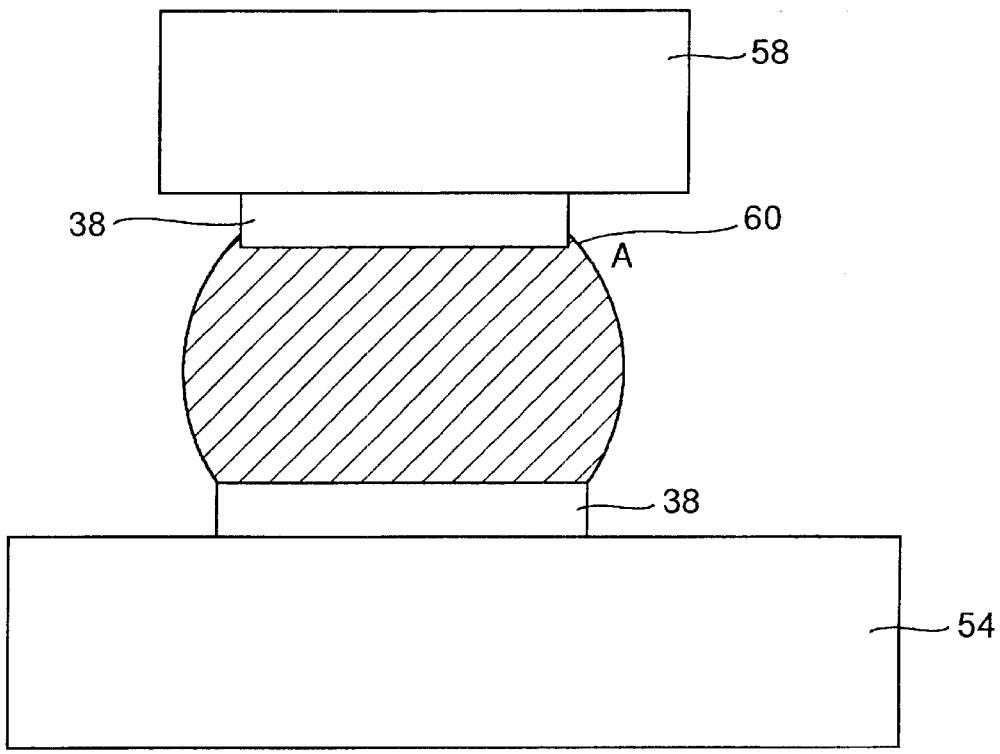

FIGS. 9A and 9B show typical example of CSP package, in which FIG. 9A shows the condition before connection and FIG. 9B shows the condition after connection. Supply of solder to the relay board terminal of the package 58 is in a form of ball or paste, in which Sn-0.3Cu-5In solder is supplied on Cu pad or Cu/Ni/Au plating. To the terminal 38 on the organic board 54 (printed circuit board), Sn-3Ag-0.5Cu solder 59 is preliminarily supplied by printing. Then, the package is mounted on the printed circuit board together with other LSI packages, parts and so forth. Then, the printed circuit board mounting the LSI packages parts and so forth is transported at a conveyer speed of 1 m/min at maximum 240° C. of temperature under atmospheric pressure using a forced-circulation type air reflow furnace, in which temperature distribution in the printed circuit board easily becomes uniform. On package side of the connected bump is mainly consisted of Sn—Cu—In even as mixed.

Joints simply joined by Sn-3Ag-0.5Cu ball or Sn-3Ag-0.5Cu paste may cause breakage in the solder portion (A portion) 60, in the vicinity of the joint interface close to the package side and possibly cause stress concentration. In case of Sn—Cu—In type solder, since it is soft, can be elongated, having low strength, concentrated stress can be absorbed by deformation of the solder to make the lift time longer. On the other hand, even for impact, such as that upon falling down, similar effect can be expected. Namely, it is assumed that the position to cause stress concentration is the portion (A portion). In case of Sn-3Ag-0.5Cu solder, concentrated stress upon occurrence of impact due to falling down, acts on the joint interface to possibly cause breakage in the solder portion in the vicinity of the joint interface or in the joint interface. Even when joint strength is high, stress is concentrated to one point to normally cause a problem to possibly result in breakage.

Accordingly, it is important to make the solder soft and easily deformable at the stress concentrating portion. As material characteristics of the solder, it is required that tensile strength is small, superior in elongation, small in Young's module. Therefore, in view of metal structure, it is required that the structure does not disperse $Ag_3Sn$ in Sn crystal of the stress concentrating portion, soft In is solved for soften Sn crystal, and melting point is lowered by containing Cu in amount smaller than that in eutectic (0.75%).

As other application, BGA bump is formed with Sn—Cu—In type. For giving importance for repair, it is possible to join with low temperature type Sn-1Ag-(40~57Bi) (solid phase linear temperature: 137° C.) paste.

Even when repair is performed for several times, high temperature type Sn—Cu—In type solder may not be deformed. Solder on the side of printed circuit board can be leveled and supplied at a temperature close to 200° C.

According to the present invention, falling down resistance or impact resistance in the electronic equipment can be improved. On the other hand, the semiconductor device die-bonded the Si chip or the like weak to thermal shock causing large deformation or connection of BGA, CSP on the printed circuit board, interface breakage can be caused by Sn—Ag—Cu type Pb free solder. The present invention can restrict interface breakage. On the other hand, reliability of solder connection in the power module, to which large stress may act, can be improved.

Further, at a low temperature, β-Sn (Body-Centered Cubic Crystal) is transformed into α-Sn (Simple Cubic Crystal), as known as pest. (Refer to Pages 357, 368 of "Mounting Technology of Surface Mount Type LSI Package and Reliability Thereof" published by Ohyo Gijutsu Shuppan Inc.) In addition, in Sn—Cu system, crystalline transformation of Sn is likely to occur. Particularly, when the sample coagulated by the rapid cooling is placed at the low temperature during a long period, it is supposed to increase the possibility of causing pest mainly due to the effect of the stress. By adding In which is soft and soluble in Sn, the stress of the grain boundaries etc. are reduced, so that an effect of delaying the pest can be expected like Pb.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. An electronic equipment having a circuit board and an electronic parts to be electrically connected to an electrode of said circuit board, wherein said electrode of said circuit board and an electrode of said electronic part being connected by soldering using a lead free solder comprising:
   Cu: 0~2.0 mass %;
   In: 0.1~7.0 mass %; and
   Sn: remaining amount.

2. An electronic equipment as set forth in claim 1, wherein said lead free solder comprises:
   Cu: 0.1~1.5 mass %;
   In: 0.5~2.0 mass %; and
   Sn: remaining amount.

3. An electronic equipment as set forth in claim 1, wherein said lead free solder comprises:
   Cu: 0.1~1.5 mass %;
   In: 0.5~7.0 mass %;
   Ag: 0~1.0 mass %; and
   Sn: remaining amount.

4. An electronic equipment as set forth in claim 1, wherein said lead free solder comprises:
   Cu: 0.1~1.5 mass %;
   In: 0.5~7.0 mass %;
   Bi: 0~1.0 mass % and
   Sn: remaining amount.

5. An electronic equipment as set forth in claim 1, wherein said electrode of said electronic part is a solder bump formed with lead free solder.

6. An electronic equipment as set forth in claim 1, wherein said electrode of said electronic part is solder connected by forming a plating layer of Sn-(1~10) mass % Bi.

7. An electronic equipment as set forth in claim 1, wherein solder connection is established by forming a plating layer of Sn-(0.2~2) mass % Cu on the electrode of said electronic part.

8. A semiconductor device comprising a semiconductor element and a bump to be electrically connected to said semiconductor element, said solder bump being lead free solder comprising:
   Cu: 0~2.0 mass %;
   In: 0.1~7.0 mass %; and
   Sn: in remaining amount.

9. A semiconductor device as set forth in claim 8, wherein said lead free solder comprises:
   Cu: 0.1~1.5 mass %;
   In: 0.5~2.0 mass %; and
   Sn: remaining amount.

10. A semiconductor device as set forth in claim 1, wherein said lead free solder comprises:
    Cu: 0.1~1.5 mass %;
    In: 0.5~7.0 mass %;
    Ag: 0~1.0 mass %; and
    Sn: remaining amount.

11. A semiconductor device as set forth in claim 8, wherein said lead free solder comprises:
    Cu: 0~2.0 mass %;
    In: 0.1~7.0 mass %; and
    Sn: remaining amount.

12. A semiconductor module having a circuit board and an electronic parts to be electrically connected to an electrode of said circuit board, wherein said circuit board and an external connection terminal to be externally connecting portion to be connected electrically being connected by soldering using a lead free solder comprising:
    Cu: 0~2.0 mass %;
    In: 0.1~7.0 mass %; and
    Sn: remaining amount.

13. A semiconductor module having a circuit board, electronic parts electrically connected to an electrode of said circuit board, and an external connection terminal of the circuit board, wherein said externap connection terminal is a lead free solder consisting essentially of:
    Cu: 0.1–0.7 weight %;
    In: 0.2–5.0 weight %; and
    Sn: remaining amount.

14. The semiconductor module of claim 13 wherein the lead free solder consists essentially of:
    Cu: 0.1–0.1 weight %;
    In: 0.5–2.0 weight %; and
    Sn: remaining amount.

15. The semiconductor module of claim 13, wherein the lead free solder consists essentially of:
    Cu: 0.1–0.7 weight %;
    In: 1.0–2.0 weight %; and
    Sn: remaining amount.

16. A semiconductor module having a circuit board, electronic parts electrically connected to an electrode of said circuit board, and an external connection terminal at the circuit board, wherein said externa connection terminal is a lead free solder consisting essentially of:
    Cu: 0.1–0.7 weight %;
    In: 0.2–5.0 weight %;
    Ag: 0–1.0 weight; and
    Sn: remaining amount.

17. The semiconductor module of claim 16, wherein the lead free soder comprises:

Cu: 0.1–0.7 weight %;

In: 0.5–2.0 weight %:

Ag: 0–1.0 weight %; and

Sn: remaining amount.

18. The semiconductor module of claim 16 wherein the lead free solder comprises:

Cu: 0.1–0.7 weight %;

In: 1.0–2.0 weight %;

Ag: 0–1.0 weight %; and

Sn: remaining amount.

\* \* \* \* \*